(12) United States Patent
Lin et al.

(10) Patent No.: US 11,476,234 B2
(45) Date of Patent: Oct. 18, 2022

(54) CHIP PACKAGE STRUCTURE AND MANUFACTURING METHOD THEREOF

(71) Applicant: Unimicron Technology Corp., Taoyuan (TW)

(72) Inventors: Pu-Ju Lin, Hsinchu (TW); Chi-Hai Kuo, Taoyuan (TW); Kai-Ming Yang, Hsinchu County (TW); Cheng-Ta Ko, Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 91 days.

(21) Appl. No.: 16/846,429

(22) Filed: Apr. 13, 2020

(65) Prior Publication Data

US 2021/0296291 A1 Sep. 23, 2021

(30) Foreign Application Priority Data

Mar. 17, 2020 (TW) .................. 109108752

(51) Int. Cl.
*H01L 25/075* (2006.01)
*H01L 33/62* (2010.01)
*H01L 33/00* (2010.01)
*H01L 33/52* (2010.01)

(52) U.S. Cl.
CPC ...... *H01L 25/0753* (2013.01); *H01L 33/0095* (2013.01); *H01L 33/52* (2013.01); *H01L 33/62* (2013.01); *H01L 2933/005* (2013.01); *H01L 2933/0066* (2013.01)

(58) Field of Classification Search
CPC combination set(s) only.
See application file for complete search history.

(56) References Cited

U.S. PATENT DOCUMENTS

2005/0035464 A1\* 2/2005 Ho .................. H05K 3/3436
257/737
2011/0198114 A1\* 8/2011 Maeda ............. H01L 23/49811
174/257

(Continued)

FOREIGN PATENT DOCUMENTS

TW I665797 7/2019

OTHER PUBLICATIONS

"Office Action of Taiwan Counterpart Application", dated Aug. 25, 2016, p. 1-p. 7.

*Primary Examiner* — Ratisha Mehta
(74) *Attorney, Agent, or Firm* — JCIPRNET (57) ABSTRACT

A manufacturing method of chip package structure includes following steps. A carrier is provided. A first patterned circuit layer and a first dielectric layer covering the first patterned circuit layer have been formed on the carrier. A flat structure layer is formed on the first dielectric layer. A second dielectric layer is formed on the first dielectric layer and covers the flat structure layer and a portion of the first dielectric layer. A second patterned circuit layer is formed on the second dielectric layer. The second patterned circuit layer includes a plurality of pads. An orthographic projection of the flat structure layer on the carrier overlaps orthographic projections of the pads on the carrier. A plurality of chips are disposed on the pads. A molding compound is formed to cover the second dielectric layer and encapsulate the chips and the pads.

12 Claims, 6 Drawing Sheets

(56) References Cited

U.S. PATENT DOCUMENTS

| | | | |
|---|---|---|---|
| 2016/0020163 A1* | 1/2016 | Shimizu | H01L 23/49822 361/768 |
| 2016/0343695 A1 | 11/2016 | Lin et al. | |
| 2017/0092824 A1* | 3/2017 | Kim | H01L 33/58 |
| 2018/0151546 A1* | 5/2018 | Lin | H01L 25/105 |
| 2021/0098354 A1* | 4/2021 | Wu | H01L 23/5383 |
| 2021/0098421 A1* | 4/2021 | Wu | H01L 23/564 |

* cited by examiner

CHIP PACKAGE STRUCTURE AND MANUFACTURING METHOD THEREOF

CROSS-REFERENCE TO RELATED APPLICATION

This application claims the priority benefit of Taiwan application no. 109108752, filed on Mar. 17, 2020. The entirety of the above-mentioned patent application is hereby incorporated by reference herein and made a part of this specification.

TECHNICAL FIELD

The invention relates to a package structure and a manufacturing method, and more particularly, to a chip package structure and a manufacturing method thereof.

BACKGROUND

In a manufacturing process of fan-out panel level package (FOPLP), if a redistribution circuit layer is first fabricated on a substrate, a circuit build-up structure will be built up from thick circuits to fine circuits. Because a liquid dielectric material is used as an insulation layer, an uneven surface is likely to occur after a coating is added for build-up. Consequently, as a coplanarity of pads will be greater than 10 μm, micro light-emitting diode chips came through mass transfer cannot be smoothly assembled on the pads of the substrate.

SUMMARY

The invention provides a chip package structure having a more preferable structural reliability.

The invention further provides a manufacturing method of chip package structure for manufacturing the aforementioned chip package structure, which has a more preferable process yield rate.

A manufacturing method of chip package structure of the invention includes following steps. A carrier is provided. A first patterned circuit layer and a first dielectric layer covering the first patterned circuit layer have been formed on the carrier. A flat structure layer is formed on the first dielectric layer. A second dielectric layer is formed on the first dielectric layer and covers the flat structure layer and a portion of the first dielectric layer. A second patterned circuit layer is formed on the second dielectric layer. The second patterned circuit layer includes a plurality of pads. An orthographic projection of the flat structure layer on the carrier overlaps orthographic projections of the pads on the carrier. A plurality of chips are disposed on the pads. A molding compound is formed to cover the second dielectric layer and encapsulate the chips and the pads.

In an embodiment of the invention, the manufacturing method of chip package structure further includes: before forming the flat structure layer on the first dielectric layer, forming at least one first opening on the first dielectric layer. The first opening exposes a portion of the first patterned circuit layer. At least one first conductive via is formed in the at least one first opening. The at least one first conductive via is electrically connected to the first patterned circuit layer. After forming the second dielectric layer to cover the flat structure layer and before forming the second patterned circuit layer on the second dielectric layer, at least one second opening is formed on the second dielectric layer. The second opening exposes a portion of the flat structure layer. At least one second conductive via is formed in the at least one second opening, wherein the second conductive via is electrically connected to the flat structure layer.

In an embodiment of the invention, the flat structure layer includes a plurality of flat structure portions separated from each other. At least one of the flat structure portions is electrically connected to the first conductive via and the second conductive via. The chips are electrically connected to the second conductive via through the pads.

In an embodiment of the invention, an orthographic projection area of the flat structure layer on the carrier is equal to or greater than an orthographic projection area of the pads on the carrier.

In an embodiment of the invention, the manufacturing method of chip package structure further includes: after forming the second patterned circuit layer on the second dielectric layer and before disposing the chips on the pads, forming a surface finish layer on the second patterned circuit layer.

In an embodiment of the invention, the chips include at least one red micro light-emitting element, at least one green micro light-emitting element and at least one blue micro light-emitting element.

In an embodiment of the invention, a coplanarity of the pads is less than 0.5 μm.

A chip package structure of the invention includes a carrier, a first dielectric layer, a flat structure layer, a second dielectric layer, a second patterned circuit layer, a plurality of chips and a molding compound. A first patterned circuit layer is disposed on the carrier. The first dielectric layer covers the first patterned circuit layer and the carrier. The flat structure layer is disposed on the first dielectric layer. The second dielectric layer is disposed on the first dielectric layer to cover the flat structure layer and a portion of the first dielectric layer. The second patterned circuit layer is disposed on the second dielectric layer, and includes a plurality of pads. An orthographic projection of the flat structure layer on the carrier overlaps orthographic projections of the pads on the carrier. The chips are disposed on the pads. The molding compound covers the second dielectric layer and encapsulates the chips and the pads.

In an embodiment of the invention, the chip package structure further includes: at least one first conductive via and at least one second conductive via. The first dielectric layer has at least one first opening, and the first conductive via is disposed in the first opening, wherein the first conductive via is electrically connected to the first patterned circuit layer. The second dielectric layer has at least one second opening, and the second conductive via is disposed in the second opening, wherein the second conductive via is electrically connected to the flat structure layer.

In an embodiment of the invention, the flat structure layer includes a plurality of flat structure portions separated from each other. At least one of the flat structure portions is electrically connected to the first conductive via and the second conductive via. The chips are electrically connected to the second conductive via through the pads.

In an embodiment of the invention, an orthographic projection area of the flat structure layer on the carrier is equal to or greater than an orthographic projection area of the pads on the carrier.

In an embodiment of the invention, the chip package structure further includes: a surface finish layer, disposed on the second patterned circuit layer.

In an embodiment of the invention, the chips include at least one red micro light-emitting element, at least one green micro light-emitting element and at least one blue micro light-emitting element.

In an embodiment of the invention, a coplanarity of the pads is less than 0.5 μm.

Based on the above, in the design of the chip package structure of the invention, the orthographic projection of the flat structure layer on the carrier overlaps the orthographic projections of the pads on the carrier. That is, by disposing the flat structure layer below the pads, the flatness of the second dielectric layer may be controlled. As a result, the pads with the coplanarity may be obtained in the subsequent assembly to improve a yield rate in the subsequent process of mounting chips onto the pads. In this way, the chip package structure of the invention can have the more preferable structural reliability.

To make the aforementioned more comprehensible, several embodiments accompanied with drawings are described in detail as follows.

DETAILED DESCRIPTION

FIG. 1A to FIG. 1H are cross-sectional views for illustrating a manufacturing method of chip package structure according to an embodiment of the invention. FIG. 2 is a partial top view of chips, pads and a flat structure layer in FIG. 1G.

A manufacturing method of chip package structure of the present embodiment is provided as follows. First of all, referring to FIG. 1A, a carrier 110 is provided, wherein the carrier 110 is, for example, a printed circuit board or a temporary substrate without electrical function, but not limited thereto.

Next, referring to FIG. 1A again, a first patterned circuit layer 120 is formed on the carrier 110, wherein the first patterned circuit layer 120 is located on a surface 112 of the carrier 110 and exposes a portion of the surface 112.

Figure 1A:
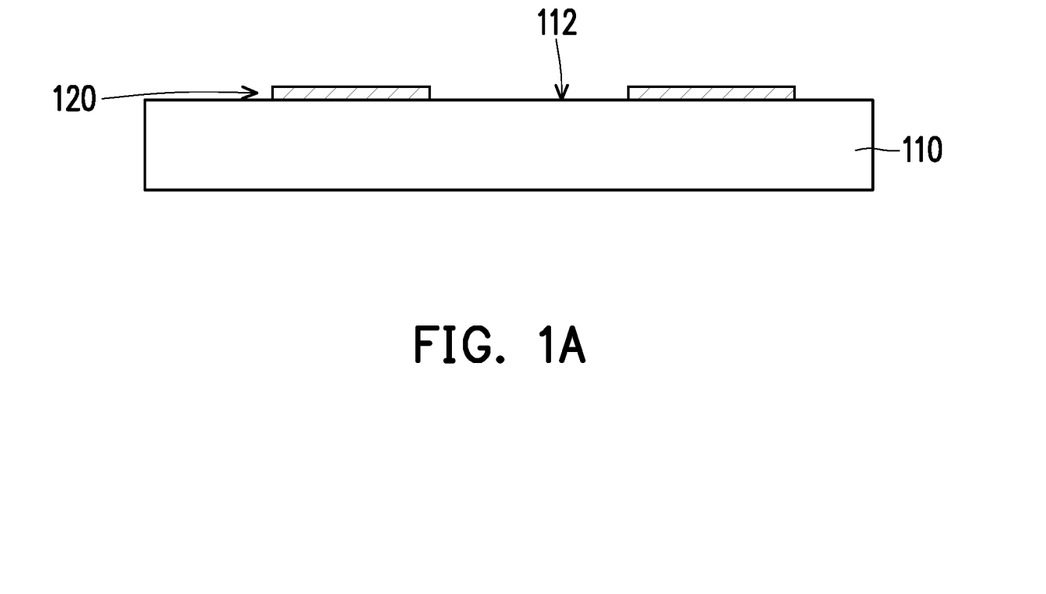
FIG. 1A to FIG. 1H are cross-sectional views for illustrating a manufacturing method of chip package structure according to an embodiment of the invention.
Figure 1B:
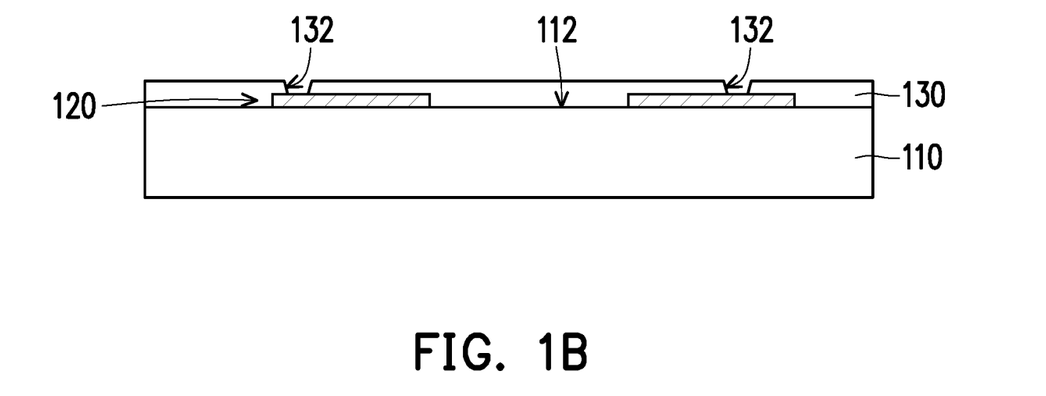
Figure 2:
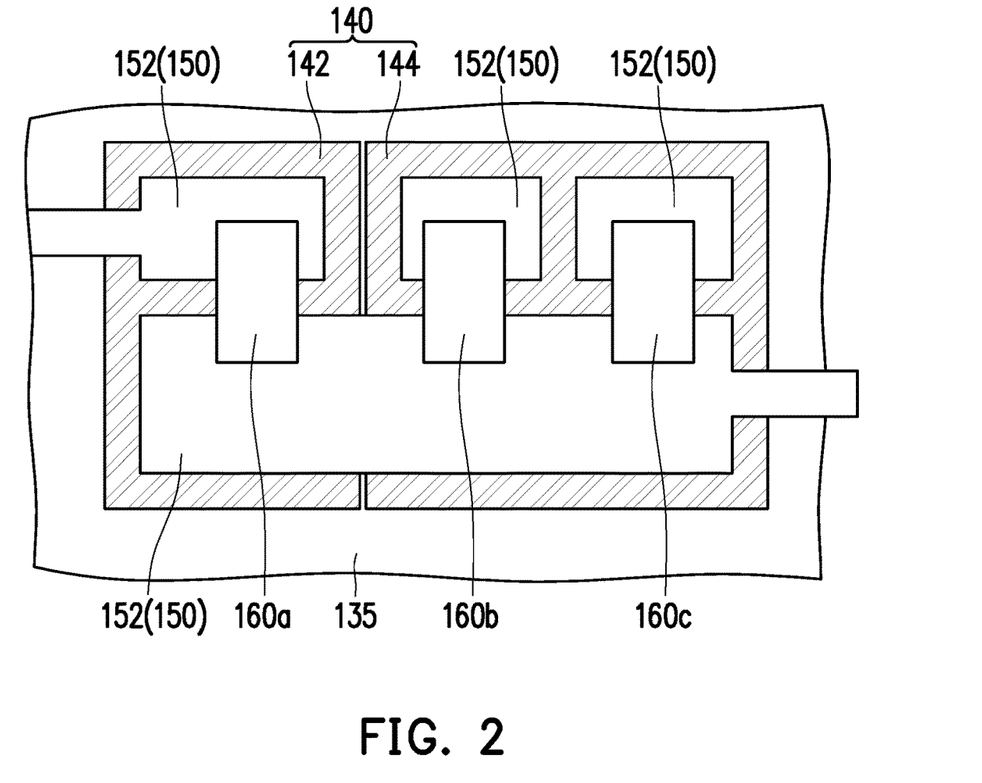
FIG. 2 is a partial top view of chips, pads and a flat structure layer in FIG. 1G.

Next, referring to FIG. 1B, a first dielectric layer 130 is formed on the surface 112 of the carrier 110, wherein a first dielectric layer 130 covers the first patterned circuit layer 120 and a portion of the surface 112 of the carrier 110. Here, the first dielectric layer 130 is formed on the carrier 110 through a liquid dielectric material in a coating manner, for example. p Next, referring to FIG. 1B again, at least one first opening (two first openings 132 are schematically depicted) is formed on the first dielectric layer 130, wherein the first opening 132 exposes a portion of the first patterned circuit layer 120.

Figure 1C:
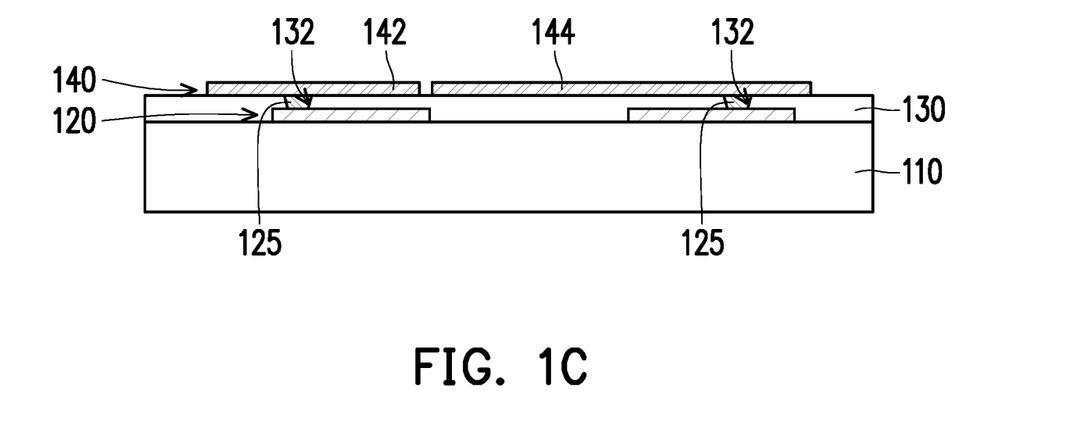

Next, referring to FIG. 1C, at least one first conductive via (two first conductive vias 125 are schematically depicted) is formed in the first opening 132, wherein the first conductive via 125 is electrically connected to the first patterned circuit layer 120.

Next, referring to FIG. 1C again, a flat structure layer 140 is formed on the first dielectric layer 130, wherein the flat structure layer 140 covers the first conductive via 127 and a portion of the first dielectric layer 130. Here, the flat structure layer 140 includes a plurality of flat structure portions 142 and 144 separated from each other, wherein at least one of the flat structure portions 142 and 144 is electrically connected to the first conductive via 125. In other words, the flat structure layer 140 may be regarded as a patterned flat structure layer.

Figure 1D:
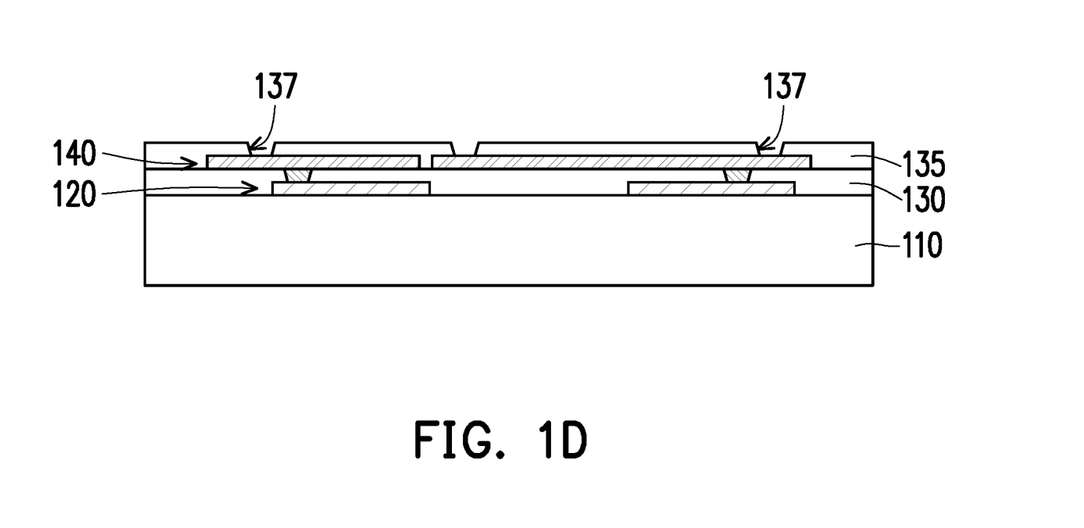

Next, referring to FIG. 1D, a second dielectric layer 135 is formed on the first dielectric layer 130, wherein the second dielectric layer 135 covers the flat structure layer 140 and a portion of the first dielectric layer 130. Here, the first dielectric layer 130 is formed on the carrier 110 through a liquid dielectric material in a coating manner, for example.

Next, referring to FIG. 1D again, at least one second opening (two second openings 137 are schematically depicted) is formed on the second dielectric layer 135, wherein the second opening 137 exposes a portion of the flat structure layer 140.

Figure 1E:
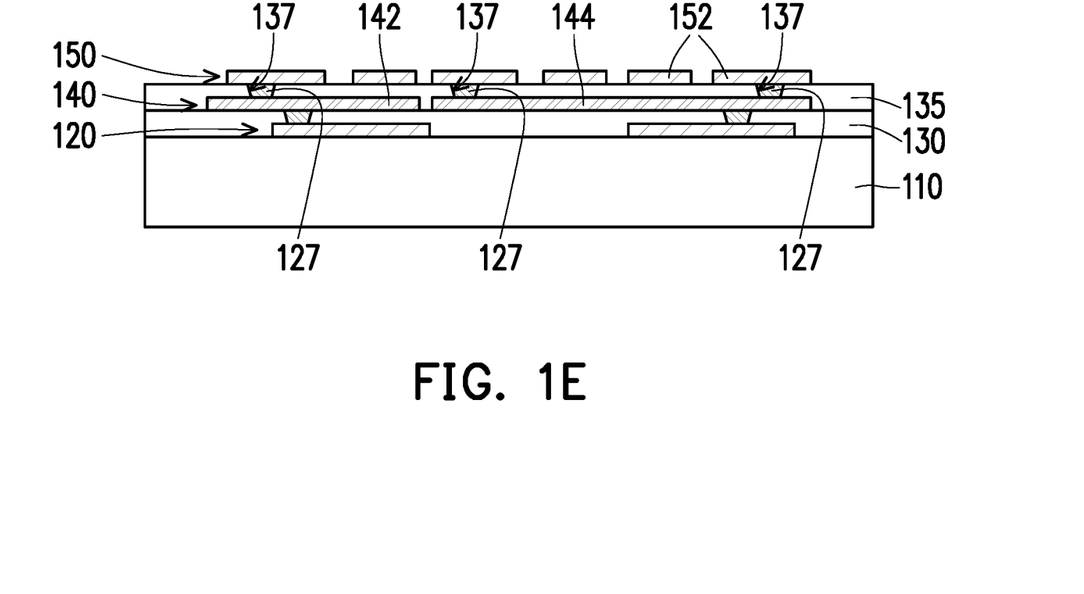

Next, referring to FIG. 1E, at least one second conductive via (three second conductive vias 127 are schematically depicted) is formed in the second opening 137, wherein the second conductive via 127 is electrically connected to the flat structure layer 140. As shown in FIG. 1E, at least one of the flat structure portions 142 and 144 of the present embodiment is electrically connected to the first conductive via 125 and the second conductive via 127, but not limited thereto.

Next, referring to FIG. 1E again, a second patterned circuit layer 150 is formed on the second dielectric layer 135, wherein the second patterned circuit layer 150 includes a plurality of pads 152. In particular, an orthographic projection of the flat structure layer 140 on the carrier 110 overlaps orthographic projections of the pads 152 on the carrier 110. In an embodiment, a material of the flat structure layer 140 may be identical to a material of the first patterned circuit layer 120 and a material of the second patterned circuit layer 150.

Referring to FIG. 1E and FIG. 2 together, because the flat structure layer 140 is disposed below the pads 152, a flatness of the second dielectric layer 135 may be effectively controlled. Accordingly, the pads 152 with a more preferable coplanarity may be obtained to improve a yield rate in the subsequent process of mounting chips 160a, 160b and 160c (referring to FIG. 1G) onto the pads 152. More preferably, a coplanarity of the pads 152 of the present embodiment is less than 0.5 μm. Here, an orthographic projection area of the flat structure layer 140 on the carrier 110 is greater than an orthographic projection area of the pads 152 on the carrier 110, but not limited thereto.

Figure 1F:
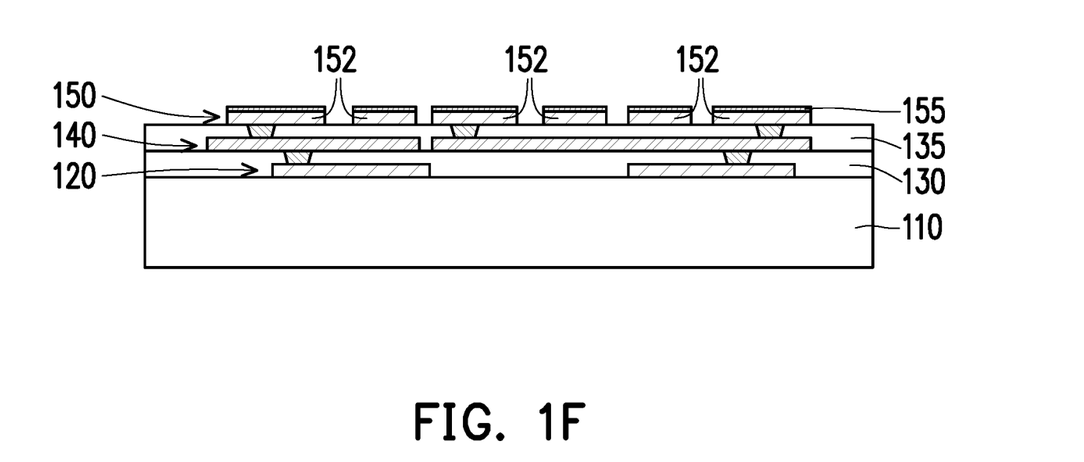

Next, referring to FIG. 1F, a surface finish layer 155 is formed on the second patterned circuit layer 150, wherein the surface finish layer 155 covers the second patterned circuit layer 150, and is conformally disposed with the second patterned circuit layer 150.

Figure 1G:
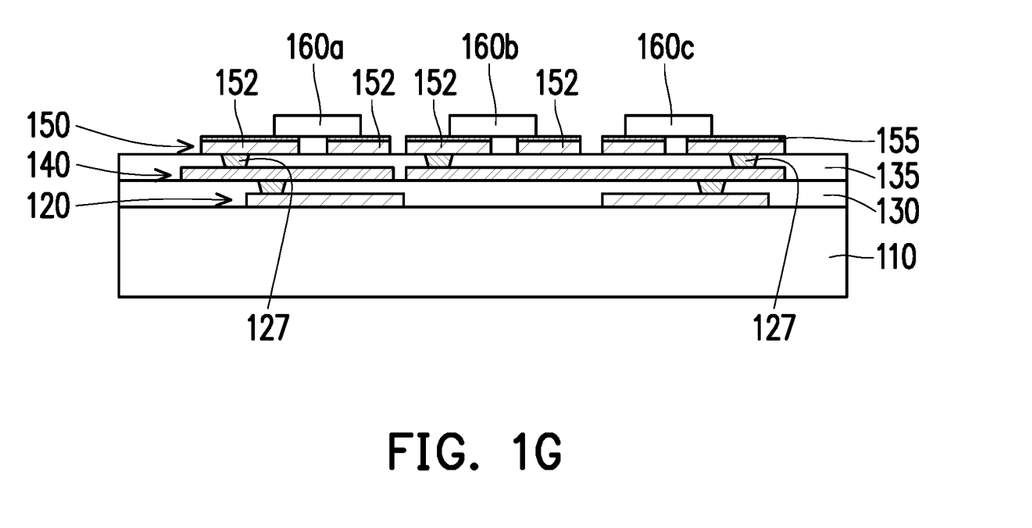

Then, referring to FIG. 1G, the chips 160a, 160b and 160c are disposed on the pads 152, wherein the chips 160a, 160b and 160c are electrically connected to the second conductive via 127 through the pads 152. Here, the chip 160a is, for example, a red micro light-emitting element; the chip 160b is, for example, a green micro light-emitting element; and the chip 160c is, for example, a blue micro light-emitting element, but not limited thereto.

Figure 1H:
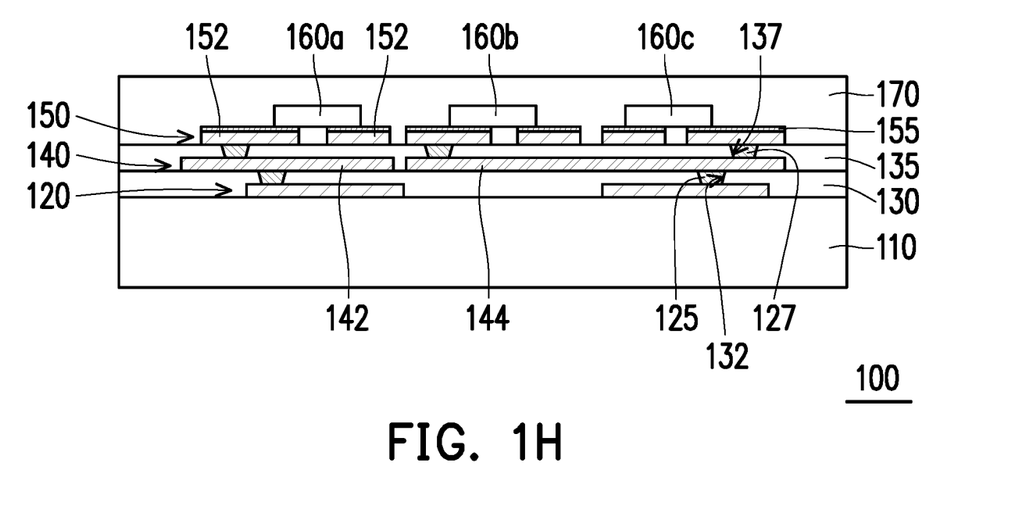

Lastly, referring to FIG. 1H, a molding compound 170 is formed to cover the second dielectric layer 135 and encapsulate the chips 160a, 160b and 160c and the pads 152. At this point, the making of the chip package structure 100 is completed.

Structurally, referring to FIG. 1H again, the chip package structure 100 of the present embodiment includes the carrier 110, the first dielectric layer 130, the flat structure layer 140, the second dielectric layer 135, the second patterned circuit layer 150, the chips 160a, 160b and 160c and the molding compound 170. The first patterned circuit layer 120 is disposed on the carrier 110. The first dielectric layer 130 covers the first patterned circuit layer 120 and the carrier 110. The flat structure layer 140 is disposed on the first dielectric layer 130, wherein the flat structure layer 140 includes the flat structure portions 142 and 144 separated from each other, The second dielectric layer 135 is disposed on the first dielectric layer 130 to cover the flat structure layer 140 and a portion of the first dielectric layer 130. The second patterned circuit layer 150 is disposed on the second dielectric layer 135, and includes the pads 152. In particular, the orthographic projection of the flat structure layer 140 on the carrier 110 overlaps the orthographic projections of the pads 152 on the carrier 110. Here, the orthographic projection area of the flat structure layer 140 on the carrier 110 is greater than the orthographic projection area of the pads 152 on the carrier 110. The chips 160a, 160b and 160c are disposed on the pads 152. Here, the chip 160a is, for example, a red micro light-emitting element; the chip 160b is, for example, a green micro light-emitting element; and the chip 160c is, for example, a blue micro light-emitting element, but not limited thereto. The molding compound 170 covers the second dielectric layer 135 and encapsulates the chips 160a, 160b and 160c and the pads 152.

Further, the chip package structure 100 of the present embodiment further includes the first conductive via 125 and the second conductive via 127. The first dielectric layer 130 has the first opening 132, and the first conductive via 125 is disposed in the first opening 132, wherein the first conductive via 125 is electrically connected to the first patterned circuit layer 120. The second dielectric layer 135 has the second opening 137, and the second conductive via 127 is disposed in the second opening 137, wherein the flat structure portions 142 and 144 are electrically connected to the first conductive via 125 and the second conductive via 127. The chips 160a, 160b and 160c are electrically connected to the first patterned circuit layer 120 through the pads 152, the second conductive via 127, the flat structure portions 142 and 144 and the first conductive via 125. In addition, the chip package structure 100 of the present embodiment further includes the surface finish layer 155, wherein the surface finish layer 155 disposed on the second patterned circuit layer 150.

In brief, because the orthographic projection of the flat structure layer 140 of the present embodiment on the carrier 110 overlaps the orthographic projections of the pads 152 on the carrier 110 (i.e., the flat structure layer 140 is disposed below the pads 152), the flatness of the second dielectric layer 135 may be controlled. As a result, the pads 152 with the coplanarity may be obtained in the subsequent assembly to improve a yield rate in the subsequent process of mounting chips 160a, 160b and 160c onto the pads 152. In this way, the chip package structure 100 of the present embodiment can have a better structural reliability. Moreover, in the manufacturing method of the chip package structure 100 of the present embodiment, since a board transfer process is not required, the process steps can be simplified to provide better process yield and lower production cost.

It should be noted that the reference numerals and a part of the contents in the previous embodiment are used in the following embodiments, in which identical reference numerals indicate identical or similar components, and repeated description of the same technical contents is omitted. For a detailed description of the omitted parts, reference can be found in the previous embodiment, and no repeated description is contained in the following embodiments.

Figure 3:
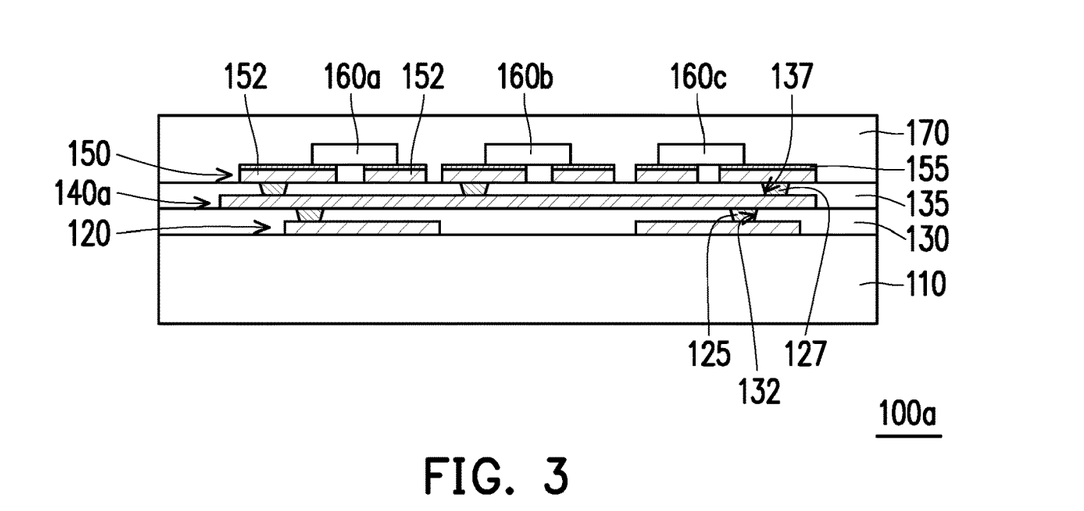
FIG. 3 is a schematic cross-sectional view of a chip package structure according to an embodiment of the invention.

FIG. 3 is a schematic cross-sectional view of a chip package structure according to an embodiment of the invention. Referring to FIG. 1H and FIG. 3 together, a chip package structure 100a of the present embodiment is similar to the chip package structure 100 of FIG. 1H but differs in that, an orthographic projection area of a flat structure layer 140a on the carrier 110 of the present embodiment is greater than the orthographic projection area of the pads 152 on the carrier 110. Here, the flat structure layer 140a is a continuous structure layer.

Figure 4:
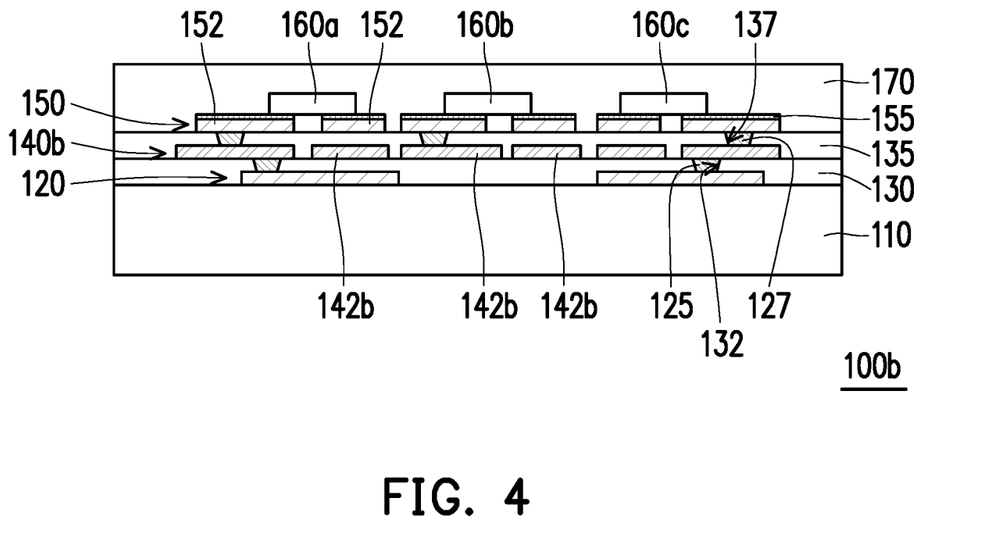
FIG. 4 is a schematic cross-sectional view of a chip package structure according to another embodiment of the invention.

FIG. 4 is a schematic cross-sectional view of a chip package structure according to another embodiment of the invention. Referring to FIG. 1H and FIG. 4 together, a chip package structure 100b of the present embodiment is similar to the chip package structure 100 of FIG. 1H but differs in that, an orthographic projection area of a flat structure layer 140b of the present embodiment on the carrier 110 is equal to the orthographic projection area of the pads 152 on the carrier 110. Here, the flat structure layer 140b includes a plurality of flat structure portions 142b separated from each other, wherein the flat structure portions 142b are disposed corresponding to the pads 152 in a one-to-one manner. That is, the flat structure layer 140b may be regarded as a patterned flat structure layer.

In summary, in the design of the chip package structure of the invention, the orthographic projection of the flat structure layer on the carrier overlaps the orthographic projections of the pads on the carrier. That is, by disposing the flat structure layer below the pads, the flatness of the second dielectric layer may be controlled. As a result, the pads with the coplanarity may be obtained in the subsequent assembly to improve a yield rate in the subsequent process of mounting chips onto the pads. In this way, the chip package structure of the invention can have the more preferable structural reliability.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

The invention claimed is:

1. A manufacturing method of chip package structure, comprising:
   providing a carrier, a first patterned circuit layer and a first dielectric layer covering the first patterned circuit layer and the carrier being formed on the carrier;
   forming at least one first opening on the first dielectric layer, wherein the at least one first opening exposes a portion of the first patterned circuit layer;
   forming at least one first conductive via in the at least one first opening, wherein the at least one first conductive via is electrically connected to the first patterned circuit layer, and the at least one first conductive via is coplanar with the first dielectric layer;

forming a flat structure layer on the first dielectric layer, wherein at least one boundary is between the flat structure layer and the at least one first conductive via, and the flat structure layer comprises a plurality of flat structure portions separated from each other, wherein the plurality of flat structure portions comprises a first structure portion and a second structure portion, and the number of the pads corresponding to the first structure portion is different from the number of pads corresponding to the second structure portion;

forming a second dielectric layer on the first dielectric layer to cover the flat structure layer and a portion of the first dielectric layer;

forming a second patterned circuit layer on the second dielectric layer, the second patterned circuit layer comprising a plurality of pads, wherein an orthographic projection of each of the plurality of flat structure portions of the flat structure layer on the carrier overlaps orthographic projections of at least two of the pads on the carrier;

disposing a plurality of chips on the pads; and forming a molding compound to cover the second dielectric layer and encapsulate the chips and the pads.

2. The manufacturing method of chip package structure according to claim 1, further comprising:

after forming the second dielectric layer to cover the flat structure layer and before forming the second patterned circuit layer on the second dielectric layer, forming at least one second opening on the second dielectric layer, wherein the at least one second opening exposes a portion of the flat structure layer; and forming at least one second conductive via in the at least one second opening, wherein the at least one second conductive via is electrically connected to the flat structure layer.

3. The manufacturing method of chip package structure according to claim 2, wherein at least one of the flat structure portions is electrically connected to the at least one first conductive via and the at least one second conductive via, and the chips are electrically connected to the at least one second conductive via through the pads.

4. The manufacturing method of chip package structure according to claim 1, further comprising:

after forming the second patterned circuit layer on the second dielectric layer and before disposing the chips on the pads, forming a surface finish layer on the second patterned circuit layer.

5. The manufacturing method of chip package structure according to claim 1, wherein the chips comprise at least one red micro light-emitting element, at least one green micro light-emitting element and at least one blue micro light-emitting element.

6. The manufacturing method of chip package structure according to claim 1, wherein a coplanarity of the pads is less than 0.5 μm.

7. A chip package structure, comprising:

a carrier;

a first patterned circuit layer, disposed on the carrier;

a first dielectric layer, covering the first patterned circuit layer and the carrier;

at least one first conductive via, the first dielectric layer having at least one first opening, the at least one first conductive via being disposed in the at least one first opening, wherein the at least one first conductive via is electrically connected to the first patterned circuit layer, and the at least one first conductive via is coplanar with the first dielectric layer;

a flat structure layer, disposed on the first dielectric layer, wherein at least one boundary is between the flat structure layer and the at least one first conductive via, and the flat structure layer comprises a plurality of flat structure portions separated from each other, wherein the plurality of flat structure portions comprises a first structure portion and a second structure portion, and the number of the pads corresponding to the first structure portion is different from the number of pads corresponding to the second structure portion;

a second dielectric layer, disposed on the first dielectric layer to cover the flat structure layer and a portion of the first dielectric layer;

a second patterned circuit layer, disposed on the second dielectric layer, and comprising a plurality of pads, wherein an orthographic projection of each of the plurality of flat structure portions of the flat structure layer on the carrier overlaps orthographic projections of at least two of the pads on the carrier;

a plurality of chips, disposed on the pads; and a molding compound, covering the second dielectric layer and encapsulating the chips and the pads.

8. The chip package structure according to claim 7, further comprising:

at least one second conductive via, the second dielectric layer having at least one second opening, the at least one second conductive via being disposed in the at least one second opening, wherein the at least one second conductive via is electrically connected to the flat structure layer.

9. The chip package structure according to claim 8, further wherein at least one of the flat structure portions is electrically connected to the at least one first conductive via and the at least one second conductive via, and the chips are electrically connected to the at least one second conductive via through the pads.

10. The chip package structure according to claim 7, further comprising:

a surface finish layer, disposed on the second patterned circuit layer.

11. The chip package structure according to claim 7, further wherein the chips comprise at least one red micro light-emitting element, at least one green micro light-emitting element and at least one blue micro light-emitting element.

12. The chip package structure according to claim 7, further wherein a coplanarity of the pads is less than 0.5 μm.

* * * * *